United States Patent

Roh

[11] Patent Number: 5,871,885
[45] Date of Patent: Feb. 16, 1999

[54] METHOD FOR FORMING A MAGNETIC POLE BY PATTERNING A MASK LAYER AND A METAL LAYER

[75] Inventor: Jae-Woo Roh, Seoul, Rep. of Korea

[73] Assignee: Daewoo Electronics, Co., Ltd., Seoul, Rep. of Korea

[21] Appl. No.: 700,891

[22] Filed: Aug. 21, 1996

[30] Foreign Application Priority Data

Sep. 30, 1995 [KR] Rep. of Korea ................ 95-33525

[51] Int. Cl.⁶ .................................................. G03F 7/26
[52] U.S. Cl. .................... 430/313; 430/312; 430/318; 430/320; 430/394; 216/22; 216/49
[58] Field of Search .................................. 430/311, 313, 430/318, 323, 312, 320, 394; 216/13, 22, 41, 49, 100, 109

[56] References Cited

U.S. PATENT DOCUMENTS

| 5,242,543 | 9/1993 | Maejima | 156/659.1 |
| 5,277,835 | 1/1994 | Ohmi | 252/79.3 |
| 5,378,309 | 1/1995 | Rabinzohn | 156/643 |

*Primary Examiner*—Kathleen Duda
*Attorney, Agent, or Firm*—Pennie & Edmonds LLP

[57] ABSTRACT

A method for forming a lower magnetic pole in a thin film magnetic head reduces the steepness of steps thereof. The method begins with the preparation of the mask layer, including a bottom surface and a sloping wall having an angle of inclination $\theta$ with respect to the bottom surface on top of the magnetic layer. Thereafter, the magnetic layer is patterned into the lower magnetic pole, including a flat bottom surface and an inclined wall which has a reduced steepness in comparison to the sloping wall of the mask layer. The inclined wall is made less steep by controlling the ratio of the etching rate of the magnetic layer to that of the mask layer.

14 Claims, 6 Drawing Sheets

ND FORMING A MAGNETIC POLE BY PATTERNING A MASK LAYER AND A METAL LAYER

METHOD FOR FORMING A MAGNETIC POLE BY PATTERNING A MASK LAYER AND A METAL LAYER

FIELD OF THE INVENTION

The present invention relates to a thin film magnetic head for use in a video cassette recorder; and, more particularly, to an improved method for forming a lower magnetic pole by employing a mask layer.

DESCRIPTION OF THE PRIOR ART

As is well known, a thin film magnetic head is widely used in reading, recording and/or erasing signals on a magnetic tape or disk. There is illustrated in FIG. 1 a schematic cross sectional view of a typical thin film magnetic head 100. The thin film magnetic head 100 includes a first magnetic layer 124 formed on a substrate 110, a second magnetic layer 126 formed on top of the first magnetic layer 124 and on a portion of a top surface of the substrate 110, a first insulation layer 134 deposited on top of a portion of the second magnetic layer 126, a patterned coil layer 140 made of a metallic conductor and formed on top of the first insulation layer 134, a second insulation layer 138 covering the patterned coil layer 140 and the first insulation layer 134 and an upper magnetic pole 136 formed on top of the second insulation layer 138, which also covers portions of the second magnetic layer 126 and the first insulation layer 134 not covered by the second insulation layer 138, wherein a lower magnetic pole 125 consists of the first and the second magnetic layers 124, 126. Further, as the second magnetic layer 126 is provided with a step on the first magnetic layer 124, each of the layers subsequently formed on top thereof is also provided with a step, resulting in a step region 142.

In FIGS. 2A to 2F, there are provided schematic cross sectional views setting forth a typical prior art method for forming the lower magnetic pole 125 on top of the substrate 110 shown in FIG. 1.

The process for the formation of the lower magnetic pole 125 begins with the formation of a seed layer 112, made of a metal, on top of the substrate 110 by using such technique as sputtering. A first photoresist layer, e.g., a positive type photoresist, is deposited on top of the seed layer 112 by using, e.g., a spin coating method, and then portions 116, 118 thereof are patterned after predetermined configurations, thereby leaving parts of the seed layer 112 exposed, as depicted in FIG. 2A.

In a subsequent step, a part 122 of the patterned portion 116 is exposed to a light beam, as shown in FIG. 2B. A first magnetic layer 124 is electroplated on the exposed portions of the seed layer 112, as illustrated in FIG. 2C, and the exposed part 122 of the patterned portion 116 is removed by applying an appropriate developer, as depicted in FIG. 2D.

Next, a second magnetic layer 126 is electroplated on top of the first magnetic layer 124 and a portion of the seed layer 112 under the exposed part 122, as depicted in FIG. 2E. The patterned portions 118 and 120 are removed, and then all unwanted first and second magnetic and seed layers are removed from the substrate 110, as illustrated in FIG. 2F.

For the next step, the first insulation layer 134 is deposited on top of the lower magnetic pole 125 and the portion of the substrate 110 which are not covered by a lower magnetic pole 125, as shown in FIG. 1. The first insulation layer 134 serves as a gap between the lower and an upper magnetic poles 125, 136, wherein the thickness of the first insulation layer 134 plays a critical role in the performance of the thin film magnetic head, since a narrower gap confines a magnetic field to a smaller portion of the magnetic tape, thus allowing more magnetic signals to be recorded on a given length of magnetic tape.

One of the major shortcomings of the above-described method is that it is difficult to form uniformly and thinly the first insulation layer 134 on the lower magnetic pole 125 due to the presence of an abrupt step 150 as indicated by the dotted circle in FIG. 2F.

SUMMARY OF THE INVENTION

It is, therefore, a primary object of the present invention is to provide a lower magnetic pole for depositing a thin insulation layer on top thereof, the insulation layer having an uniform thickness throughout.

In accordance with one aspect of the present invention, there is provided a method for forming a lower magnetic pole from a metal layer, the lower magnetic pole having a shape which allows an easy formation of a thin uniform insulation layer on top thereof, the method comprising the steps of: (a) depositing a mask layer on top of the metal layer; (b) forming a photoresist layer on top of the mask layer; (c) exposing a portion of the photoresist layer to a light beam; (d) developing the portion; (e) etching the mask layer to thereby provide a bottom surface and a sloping wall having an angle of inclination θ with respect to the bottom surface on the mask layer; and (f) patterning the metal layer into the lower magnetic pole including a flat bottom surface by using the etched mask layer, thereby obtaining an inclined wall having an angle of inclination Φ with respect to the flat bottom surface on the metal layer, wherein the angle Φ is determined by the following equation:

$$\tan \Phi = R \tan \theta$$

wherein R represents a ratio of the etching rate of the mask layer to that of the metal layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Referring to FIGS. 3A to 3F, there are shown schematic cross sectional views setting forth the steps involved in manufacturing a lower magnetic pole for use in a thin film magnetic head in accordance with the present invention.

Figure 1:
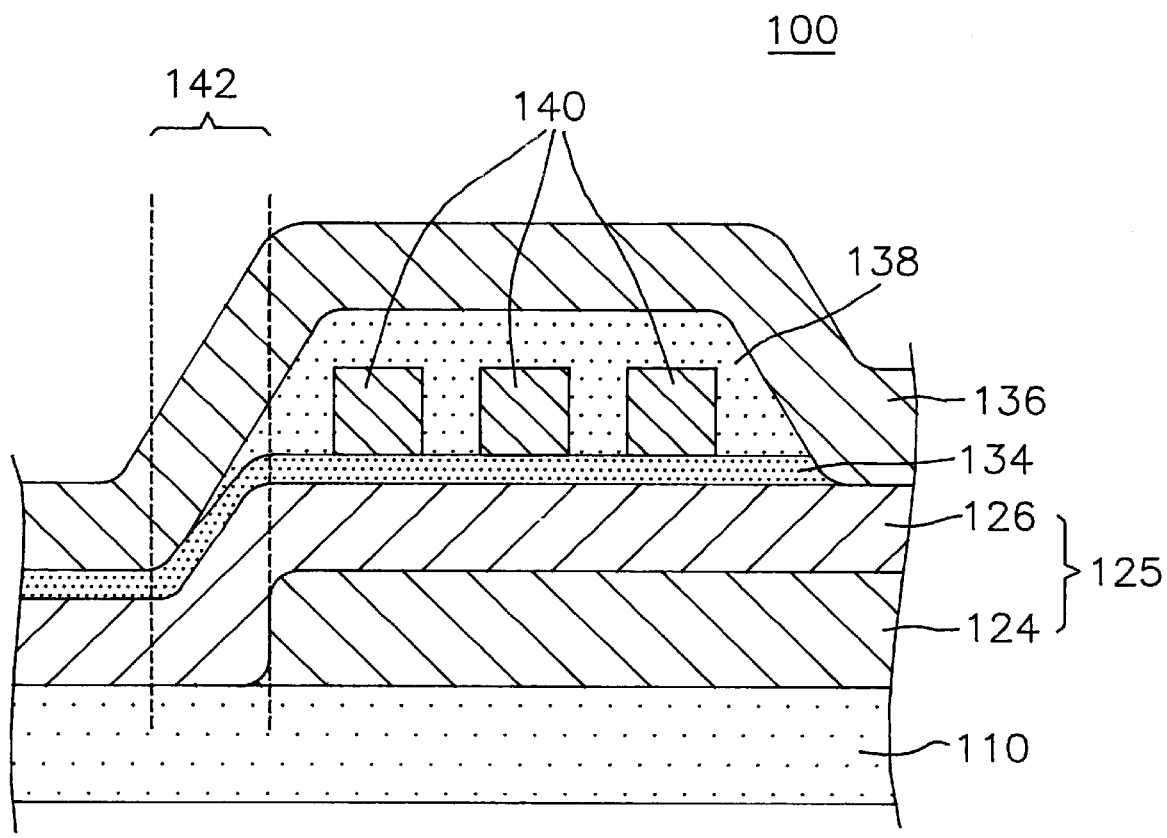
FIG. 1 shows a schematic cross sectional view of a conventional thin film magnetic head.
Figure 2A:
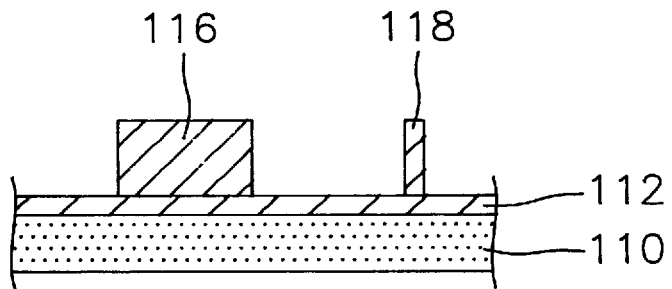
FIGS. 2A to 2F present schematic cross sectional views setting forth a typical prior art method for forming a lower magnetic pole in the thin film magnetic head shown in FIG. 1.
Figure 2B:
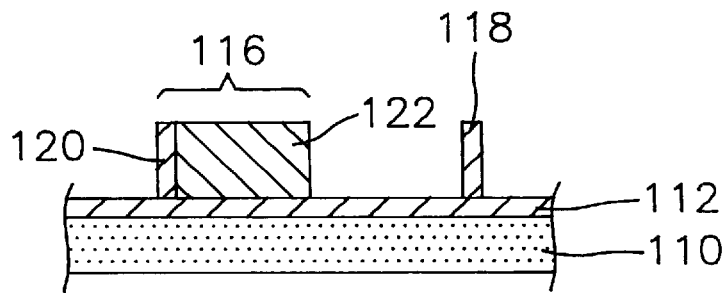
Figure 2C:
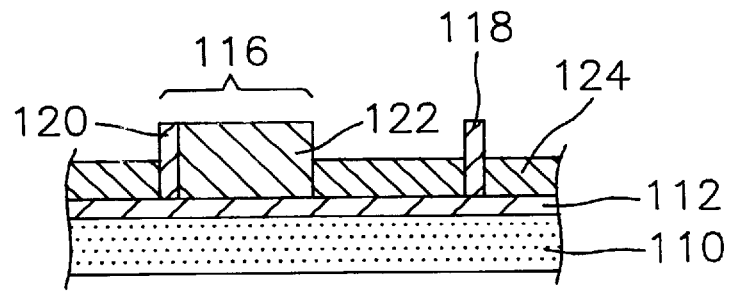
Figure 2D:
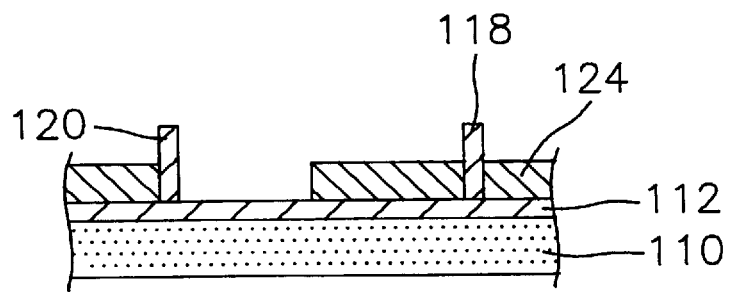
Figure 2E:
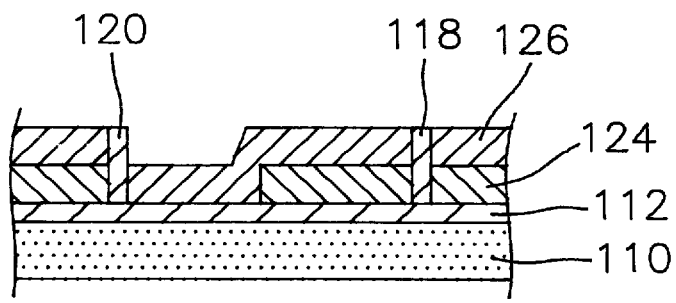
Figure 2F:
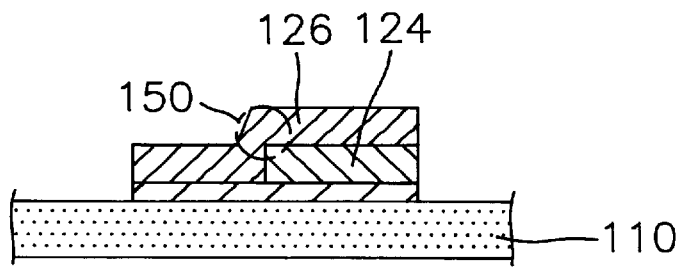
Figure 3A:
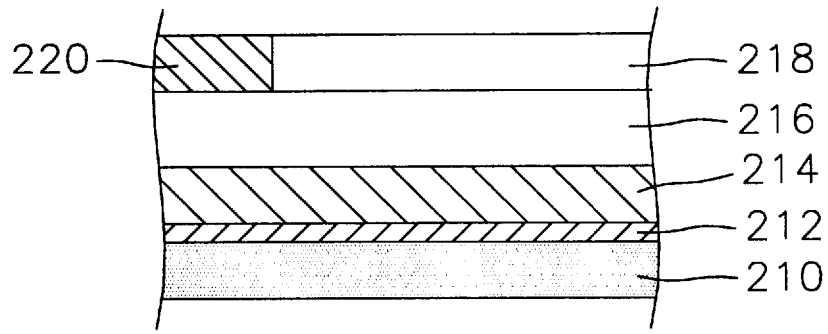
FIGS. 3A to 3F provide schematic cross sectional views illustrating a method for the manufacture of a lower magnetic pole in accordance with a preferred embodiment of the present invention.

The process for the manufacture of the lower magnetic pole begins with making a substrate 210 having a top surface, made of a non-magnetic material, such as $SiO_2$ or $Al_2O_3$, whereon a seed layer 212 is formed by using a method such as an evaporation method or a sputtering method, as shown in FIG. 3A. The seed layer 212 consists of a bottom and a top layers having thicknesses of 150–250 Å and 650–750 Å, respectively, the bottom layer being made of chrome(Cr), while the top layer being made of permalloy, e.g., Ni—Fe. Subsequently, a magnetic layer 214 having a thickness of 8–10 μm, made of permalloy, e.g., Ni—Fe, is electroplated on top of the seed layer 212. A mask layer 216, having a top surface 216a, and a bottom surface 216b and made of SiO$_2$, is deposited on top of the magnetic layer 214. It is preferable that the thickness of the mask layer 216 to be larger than that of the magnetic layer 214. A photoresist layer 218 is formed on top of the mask layer 216 by using a method such as a spin coating method and a portion 220 of the photoresist layer 218 is exposed to a light beam so as to define a size of the lower magnetic pole. A polyimide may be used for serving the same function as that of the photoresist layer.

Figure 3B:
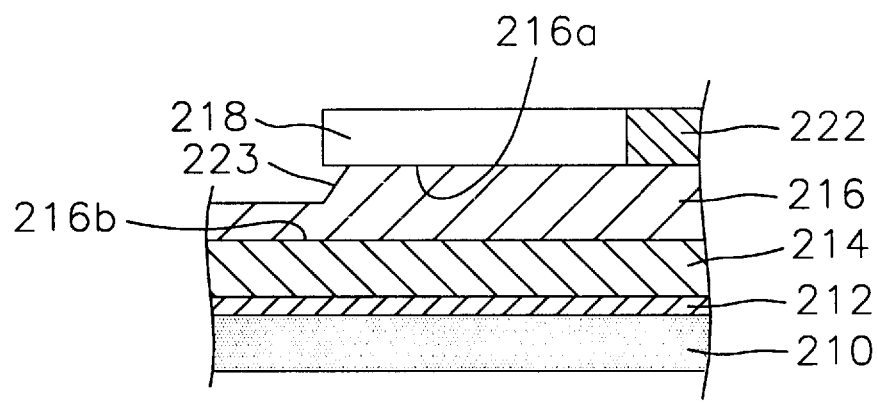
Figure 3C:
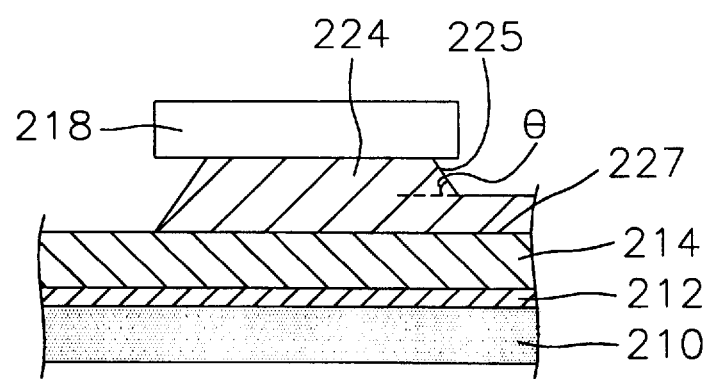
Figure 3D:
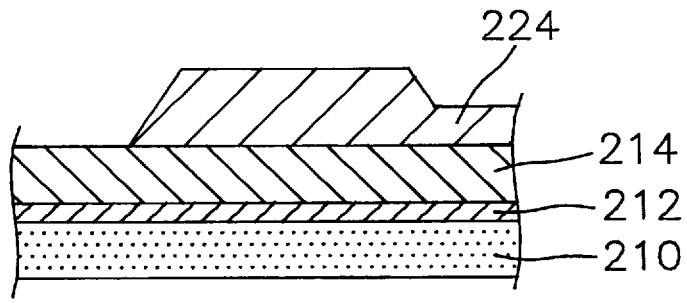

In a subsequent step, the portion 220 of the photoresist layer 218 is removed by using a developer, and then the mask layer 216 is etched by using an etchant until half of the mask layer 216 under the portion 220 is removed to thereby obtain a first sloping wall 223, as illustrated in FIG. 3B. A part 222 of the remaining portion of the photoresist layer 218 is exposed to a light beam so as to define a tip area of the lower magnetic pole. In the next step, the part 222 is removed by using a developer, and then, the mask layer 216 is etched by using the etchant until the top surface of the magnetic layer 214 is exposed to thereby obtain a patterned mask layer 224, as shown in FIG. 3C, wherein the patterned mask layer 224 includes a bottom surface 227 and a second sloping wall 225. The notation θ in FIG. 3B represents an angle formed between the bottom surface 227 of the mask layer 224 and the second sloping wall 225 of the patterned mask layer 224. In accordance with the preferred embodiments of the present invention, since the mask layer 216 is made of SiO$_2$, the etchant is prepared by mixing ammonium fluoride(NH$_4$F) with hydrogen fluoride(HF) and the angle θ can be varied by changing the composition ratio of NH$_4$F to HF. Then, the photoresist layer 218 on top of the patterned mask layer 224 is stripped off, as depicted in FIG. 3D, wherein the patterned mask layer 224 serves as a mask during the patterning of the magnetic layer 214.

Figure 3E:
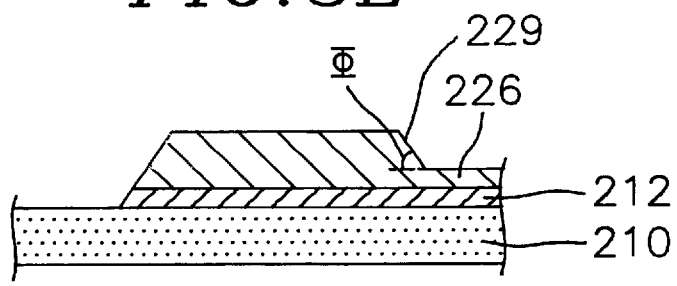

Thereafter, the magnetic layer 214 is patterned into the lower magnetic pole 226 by using a dry etching method, e.g., an ion milling, wherein the lower magnetic pole 226 includes an inclined wall 229 and a bottom surface, as shown in FIG. 3E. The notation Φ in FIG. 3E represents an angle between the bottom surface of the lower magnetic pole 226 and the inclined wall 229.

The angle Φ is determined by the following equation:

$$\tan \Phi = R \tan \theta \qquad \text{Eq. (1)}$$

wherein R represents a ratio of the etching rate of one layer to the other, and θ, the angle between the second sloping wall 225 and the bottom surface 227 of the patterned mask layer 224. Since θ is already fixed in the previous step, the magnitude of the angle Φ is determined simply by controlling R. Accordingly, by selecting an etchant which will provide R less than 1, it is possible to obtain Φ less than θ.

Figure 3F:
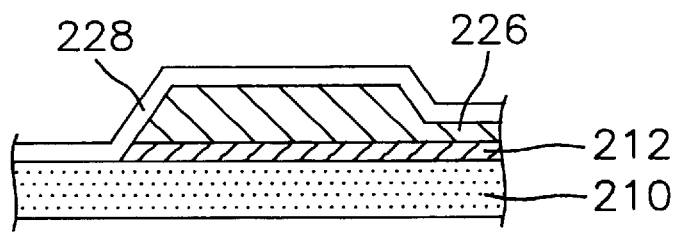

In the next step, an insulation layer 228, made of a non-magnetic material, such as SiO$_2$ or Al$_2$O$_3$, is deposited on top of the lower magnetic pole 226 and a portion of the substrate 210 which is not covered with the lower magnetic pole 226, as shown in FIG. 3F. The insulation layer 228 has a thickness of typically 0.1–0.3 μm.

In comparison with the prior art method for forming a lower magnetic pole 125 for use in a thin film magnetic head, the inventive method is capable of providing a lower magnetic pole 226 with a step having a lesser steepness by selecting and using an appropriate etchant will yield the ratio of the etching rates of the two layers to be less than one, i.e., less steep, which will, in turn, allow the formation of a thin insulation layer 228 on top thereof easier.

Even though the present invention has been described with reference to the thin film magnetic head and preferred embodiments only, it should be apparent to those skilled in the art that the formation scheme of the magnetic layer described above can be applied in any other thin film manufacturing process; and further that other modifications and variations may also be made without departing from the spirit and scope of the invention as defined in the appended claims.

What is claimed is:

1. A method for forming a lower magnetic pole in a thin film magnetic head from a metal layer, the lower magnetic pole having a shape which allows an easy formation of a thin uniform insulation layer on top thereof, the method comprising the steps of:

(a) preparing a substrate with the metal layer formed thereon;

(b) forming a mask layer on top of the metal layer;

(c) forming a photoresist layer on top of the mask layer;

(d) exposing a light beam to a portion of the photoresist so as to define a size of the lower magnetic pole;

(e) removing the portion of the photoresist by using a developer, and etching the mask layer by using an etchant until one half of the mask layer under the portion is removed;

(f) exposing a light beam to a part of the remaining portion of the photoresist layer so as to define a tip area of the lower magnetic pole;

(g) removing the part of the remaining portion of the photoresist by using a developer and etching the mask layer until the top surface of the metal layer is exposed to thereby obtain a patterned mask layer, wherein the patterned mask layer includes a bottom surface and a first and a second sloping walls, each of the sloping walls being inclined at a first predetermined angle with respect to the bottom surface of the patterned mask layer, respectively; and (h) dry-etching the metal layer by using the patterned mask layer, thereby providing the lower magnetic pole with a bottom surface, a first and a second inclined walls, each of the inclined walls being inclined at a second predetermined angle with respect to the bottom surface of the lower magnetic pole, respectively, wherein the second predetermined angle is controlled by changing the ratio of the etching rate of the metal layer to that of the mask layer.

2. The method of claim 1, wherein the substrate is made of aluminum oxide(Al$_2$O$_3$).

3. The method of claim 2, wherein the mask layer is made of silicon dioxide(SiO$_2$).

4. The method of claim 3, wherein the photoresist layer is made of polyimide.

5. The method of claim 4, wherein the metal layer is made of a magnetic material.

6. The method of claim 5, wherein the magnetic material is made of a permalloy.

7. The method of claim 5, wherein the metal layer has a thickness of 8–10 μm.

8. A method for forming a lower magnetic pole in a thin film magnetic head, said method comprising the steps of:

(a) providing a substrate having a metal layer thereon;

(b) forming a mask layer atop said metal layer, said mask layer having a top surface, a bottom surface, and a first thickness therebetween, said first thickness being greater than a thickness of said metal layer;

(c) forming a photoresist layer atop the mask layer;

(d) removing a first portion of the photoresist layer to expose a first portion of the mask layer;

(e) etching said first portion of the mask layer down to approximately one-half of said first thickness;

(f) removing a second portion of the photoresist layer to expose a second portion of said mask layer;

(g) continuing to etch said first portion of the mask layer until reaching said metal layer while simultaneously etching said second portion of said mask layer down to approximately one-half of said first thickness, such that a first sloping wall extending from said metal layer to said top surface, and a second sloping wall extending from said etched second portion of the mask layer to said top surface are formed, said first and second sloping walls being sloped at a substantially same first angle;

(h) removing any photoresist material remaining atop said mask layer; and (i) etching both the metal layer and the mask layer such that a lower magnetic pole having a bottom surface and at least one inclined wall is formed, said at least one inclined wall being sloped at a second angle which is less steep than said first angle, and wherein the second angle is determined by controlling a ratio of the etching rate of the metal layer to the etching rate of the mask layer.

9. The method of claim 8, wherein the metal layer is etched until a portion of said substrate is exposed.

10. The method of claim 9, comprising the additional step of depositing an insulation layer atop the lower magnetic pole and said portion of said substrate.

11. The method of claim 8, wherein said lower magnetic pole has two inclined walls, said two inclined walls both being sloped at said second angle.

12. The method of claim 8, wherein the metal layer comprises a magnetic material.

13. The method of claim 12, wherein the magnetic material is made of a permalloy.

14. The method of claim 13, wherein the magnetic material has a thickness of 8–10 $\mu$m.

* * * * *